(12) United States Patent
Bluzer et al.

(10) Patent No.: US 7,989,249 B2
(45) Date of Patent: Aug. 2, 2011

(54) METHOD OF MANUFACTURING A MICRO-ELECTRICAL-MECHANICAL SYSTEM WITH THERMALLY ISOLATED ACTIVE ELEMENTS

(75) Inventors: Nathan Bluzer, Rockville, MD (US);
Silai V. Krishnaswamy, Monroville, PA (US); Philip C. Smith, Ellicott City, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 0 days.

(21) Appl. No.: 12/365,284

(22) Filed: Feb. 4, 2009

(65) Prior Publication Data

US 2010/0197063 A1  Aug. 5, 2010

(51) Int. Cl.
*H01L 21/00* (2006.01)
(52) U.S. Cl. ............. 438/55; 438/51; 257/414; 257/467
(58) Field of Classification Search .............. 438/51, 438/55; 257/414, 467
See application file for complete search history.

(56) References Cited

U.S. PATENT DOCUMENTS

| 4,590,505 | A | 5/1986 | Bluzer |
| 7,375,333 | B1 | 5/2008 | Bluzer et al. |
| 2004/0219706 | A1 | 11/2004 | Wan |
| 2005/0087687 | A1 | 4/2005 | Bluzer |
| 2006/0131506 | A1* | 6/2006 | Shigenaka et al. ....... 250/370.08 |
| 2007/0131861 | A1 | 6/2007 | Bluzer et al. |

OTHER PUBLICATIONS

International Search Report, and Written Opinion, Application No. PCT/US 10/23154, dated Mar. 23, 2010, 8 pages.

* cited by examiner

*Primary Examiner* — Matthew Smith
*Assistant Examiner* — John M Parker
(74) *Attorney, Agent, or Firm* — Rothwell, Figg, Ernst & Manbeck, P.C.

(57) ABSTRACT

A method of manufacturing a micro-electrical-mechanical system with thermally isolated active elements. Such a system may embody a bolometer, which is well suited for detecting electromagnetic radiation between 90 GHz and 30 THz while operating at room temperature. The method also discloses a generalized process for manufacturing circuitry incorporating active and passive micro-electrical-mechanical systems in a silicon wafer.

27 Claims, 15 Drawing Sheets

METHOD OF MANUFACTURING A MICRO-ELECTRICAL-MECHANICAL SYSTEM WITH THERMALLY ISOLATED ACTIVE ELEMENTS

BACKGROUND OF THE INVENTION

1. Technical Field

This invention relates generally to micro-electrical-mechanical systems (MEMs), and more particularly to active MEMs incorporated into bolometers for detecting electromagnetic radiation between about 90 GHz and about 30 THz.

2. Description of the Background Art

There have been two previously unrelated issues, each in a different field. The first issue has been a need for bolometers that could image at lower frequencies at room temperature. The second issue, unrecognized until now, is a need for MEMs systems incorporating active components, or active MEMs. One aspect of the present invention is to solve the need for improved bolometers by manufacturing bolometers that incorporate active MEMs.

The relative advantages of utilizing electromagnetic radiation sensors, specifically quantum detectors and bolometers, for specialized imaging applications are widely recognized. Quantum detectors are non-equilibrium devices that respond to the quantum nature of electromagnetic radiation and produce signals proportional to the number of photons received from a scene. Typically, for proper operation, quantum detectors designed for sensing electromagnetic radiation below 300 THz should be cooled. Bolometers, on the other hand, are equilibrium devices whose signal depends on the difference between the power received from the scene and lost to the environment through radiation, convection and/or thermal conduction. Since bolometers operate in a vacuum, the power the absorber stage, also known as the detector stage, looses to the environment is lost through radiation and thermal conduction through supporting bridges from the absorber to the environment. The absorber in bolometers is thermally isolated from the environment and typically bolometers are operated at room temperature.

While progress has been made in the development of quantum detector-based LWIR (30 THz) and MWIR (70 THz) imaging systems, the need for cooling has always complicated system design, increased weight, reduced reliability, and increased cost. The cooling problems become even more pronounced when attempting to image at lower frequencies (or longer wavelengths) for example, between about 100 GHZ and 1 THz. For this reason, there is much interest in developing bolometers imaging at room temperatures, such as between 90 GHz and 30 THz.

A bolometer based imager is typically made up of a plurality of bolometer pixels assembled into an x-y array with associated readout circuits. Each pixel includes a passive absorber element mechanically supported above a heat bath by bridges that also provide passive thermal isolation. Bolometers with passive thermal isolation have been used to construct LWIR imaging systems that operate at room temperature; however, because of insufficient thermal isolation, these systems have performed at least an order of magnitude below their theoretical sensitivity limit.

The issue of thermal isolation for imagers imaging between about 90 GHz and about 1 THz (that is at longer wavelengths) is more critical, resulting in further sensitivity degradation. To overcome limitations inherent in conventional passive thermal isolation bridge designs it has been proposed to utilize active thermal isolation to minimize thermal loading on the absorber element. Active thermal isolation utilizes electro-thermal feedback to adjust the temperature of an intermediate stage to be equal to the temperature of the absorber element, e.g., as disclosed in U.S. Pat. No. 6,489,615, incorporated herein by reference. Actively equalizing the temperature of an intermediate stage with the absorber stage creates a situation where almost zero net thermal current flows between the absorber stage and intermediate stage, or providing almost ideal thermal isolation.

Mechanizing electro-thermal feedback requires incorporating special active circuits within each bolometer pixel. These special active circuits are formed in isolated single crystal silicon island interconnected by thermally insolating mechanical/electrical bridges. Specifically, electro-thermal feedback in each pixel requires: (1) temperature sensors, (2) a temperature difference amplifier, (3) a heater with an output dependent on temperature difference, and (4) a structure which incorporates these items with an absorber element into a single pixel.

One approach to solving this challenge requires solving the second issue, incorporating active components into a MEMs system. The realization of electrical circuits in single crystal silicon islands supported by thermal isolation bridges is a challenging electrical design and a difficult manufacturing task. Unlike conventional passive MEMs, active MEMs require the formation of the single crystal silicon islands with active components (such as diodes and/or transistors) supported and isolated by thermal insulating bridges.

One approach to creating active MEMs suspends the single crystal absorber element and the intermediate stage islands with thermally isolating bridges. Manufacturing thermally isolating bridges between nano-scale active MEMs components of a bolometer pixel poses unique challenges, in part because active MEMS processing techniques are employed to manufacture the bolometer's pixel components and these processing techniques typically involve some form of etching. Process steps involving a wet etch are particularly troublesome because the surface tension can produce crushing mechanical forces on the delicate nano-scale components in each pixel. The surface tension forces come into play during drying when the etching is completed, and the etching solution is removed. This portion of the process generates strong mechanical forces between the nano-scale components and the substrate. The strong mechanical forces are due to surface tension, and these forces can be sufficiently strong to collapse some of the nano-scale components. The difficulty is compounded with incorporation of active MEMs into the pixel structure, because the manufacturing process must combine active integrated circuit (IC) processing steps and micro-electromechanical systems (MEMs) processing steps, which are often incompatible.

SUMMARY OF THE INVENTION

It is an object of the present invention to overcome the disadvantages of the prior art.

According to an embodiment of the present invention, a method of manufacturing a single bolometer pixel or arrays of bolometer pixels where each pixel incorporates active MEMs. Active MEMs refers to single crystal silicon islands supported by and thermally isolated by nano-scale bridges. The single crystal silicon island incorporates active components such as diodes and/or transistors. The active MEMs comprising a silicon-on-insulator wafer having upper and lower silicon layers separated by a buried oxide layer, forming a detector in the upper silicon layer of the silicon-on-insulator wafer, forming one or more trenches in the upper silicon layer of the silicon-on-insulator wafer around the detector, forming active thermal compensation circuitry in an upper region outside the one or more trenches, encapsulating the detector in oxide with portions from the buried oxide layer, releasing the detector stage using an etchant gas that does not etch oxide layer, and providing mechanical support and thermal isolation for the detector element.

According to an embodiment of the present invention, a method of manufacturing a hybrid device combining integrated circuits and micro-electrical-mechanical systems, comprising providing a silicon-on-insulator wafer having upper and lower silicon layers separated by a buried oxide layer, forming an active circuit element in the upper silicon layer of the silicon-on-insulator wafer, forming one or more trenches in the upper silicon layer of the silicon-on-insulator wafer around the active circuit element, encapsulating the active circuit element in oxide with portions formed from the buried oxide layer, releasing a portion of the upper silicon layer that contains the active circuit element using an gas etchant that does not etch oxide layer, and providing mechanical support and thermal isolation for the active circuit element.

Further objects and advantages of the present invention, as well as the structure and operation of various embodiments of the present invention, are described in detail below with reference to the accompanying drawings, in which like reference numerals are used to designate like components.

BRIEF DESCRIPTION OF THE DRAWINGS

FIGS. 3-7A are cross-sectional views illustrating a method of manufacturing an active MEMs having a single crystal silicon island with active components suspended by MEMs bridges.

FIG. 14 shows the bolometer pixel with active thermal isolation after the bridges have been released.

DETAILED DESCRIPTION OF THE PREFERRED EMBODIMENTS

Figure 1:
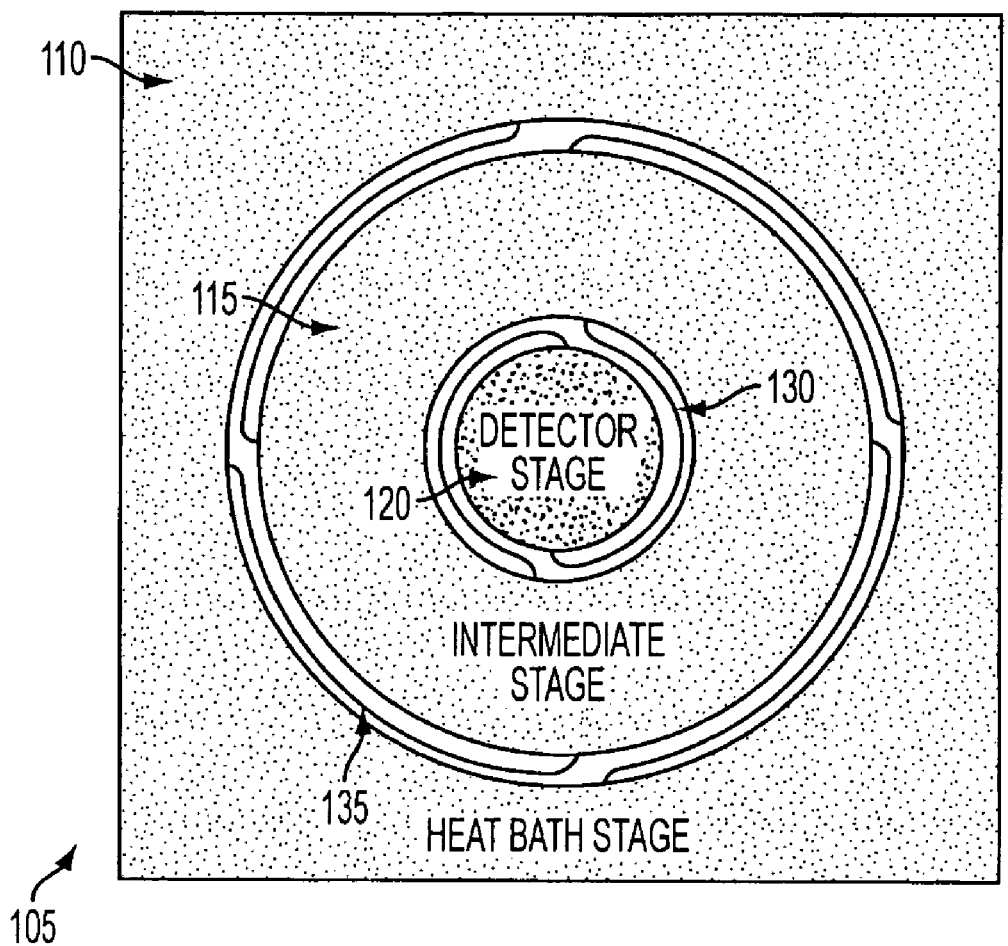
FIG. 1 is a plan view of a bolometer pixel incorporating active thermal isolation, a detector stage, an intermediate stage and a heat bath stage, but without a microantenna, according to one embodiment of the present invention.
Figure 2:
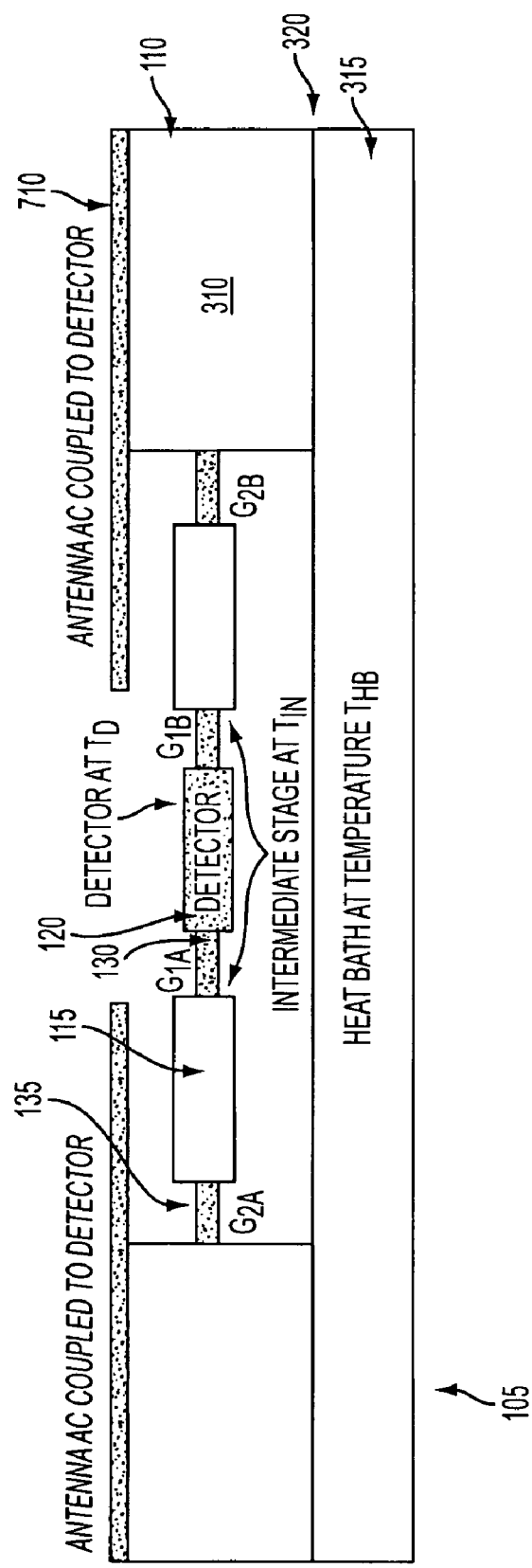
FIG. 2 is a cross-sectional view of the bolometer pixel shown in FIG. 1 with an antenna.

A bolometer pixel 105 fabricated according to a first embodiment of the method of the present invention is shown in FIGS. 1 and 2. The bolometer 105 includes three stages: a heat bath stage 110, an intermediate stage 115, and a detector stage 120. In the configuration shown, the detector stage 120 and the intermediate stage 115 are disposed within a cylindrical cavity, or well, defined in the heat bath stage 110. The detector stage 120 is shown as a circular disk and the intermediate stage 115 is shown as an annular ring that surrounds the detector stage 120. The detector 120 and intermediate 115 stages are separated by a small annular gap and are mechanically connected by a pair of bridges 130 that extend across the gap and have thermal conductances $G_{1A}$ and $G_{1B}$, respectively.

The bridges 130 are shown as arcuate members that originate at diametrically opposed locations along the inner edge of the intermediate stage 115 and terminate at diametrically opposed locations along the outer edge of the detector stage 120 spaced about 180° clockwise from their respective points of origination. Similarly, the intermediate 115 and heat bath 110 stages are separated by a small annular gap and are mechanically connected by four bridges 135 that extend across the gap and have thermal conductances $G_{2A}$, $G_{2B}$, $G_{2C}$ and $G_{2D}$, respectively. These bridges 135 are also shown as arcuate members that originate at four equiangularly spaced locations along the inner edge of the cavity and terminate at four equiangularly spaced locations along the outer edge of the intermediate stage about 90° counterclockwise from their points of origination.

Each bridge 130, 135 is made up of a very small (i.e., nano-scale) insulator, with a poor thermal conductivity, and a thin electrical wire to provide mechanical support and electrical conductivity. The heat bath stage 110 is preferably made from a single crystal silicon substrate. The detector 120 and intermediate stages 115 are coplanar and, as described in detail below, are made from single crystal silicon.

Active thermal isolation of the detector stage 120 is achieved by using electro-thermal feedback to zero the temperature difference between the detector 120 and intermediate 115 stages. Zeroing the temperature difference between these stages proportionally reduces the thermal conductivity through thermal links $G_{1A}$ and $G_{1B}$. Thus, when the detector stage temperature changes, electro-thermal feedback causes the intermediate stage's temperature to change by the same amount. Electro-thermal feedback is mechanized by having one temperature sensor on the detector stage 120 connected to a temperature sensor on the intermediate stage 115. The temperature difference between the detector and intermediate stage is converted to a voltage signal and amplified by a voltage amplifier on the intermediate stage 115. The amplified temperature difference signal drives a heater whose output power depends on the temperature difference between the detector 120 and intermediate 115 stages. The combination of adjustable heater power with constant cooling by the heat bath stage 110 provides for bipolar (increasing and decreasing) temperature tracking of the detector stage 120 by the intermediate stage 115.

The bolometer pixel 105 shown in FIGS. 1 and 2 is intended for incorporation into an array (not shown) with readout electronics for accessing the output of each individual pixel 105. An x-y array of pixels preferably includes x-y address switches for accessing each pixel 105. Conventional address circuits, column and row shift registers utilized with such apparatus are not shown. Such an array is capable of imaging the electromagnetic radiation emanating from a scene. This includes passive or active radiation in the IR and/or millimeter wavelengths. FIG. 2 also shows an antenna 710 "ac" coupled to the detector to limit the spectral response of the detector in each pixel.

Figure 3:
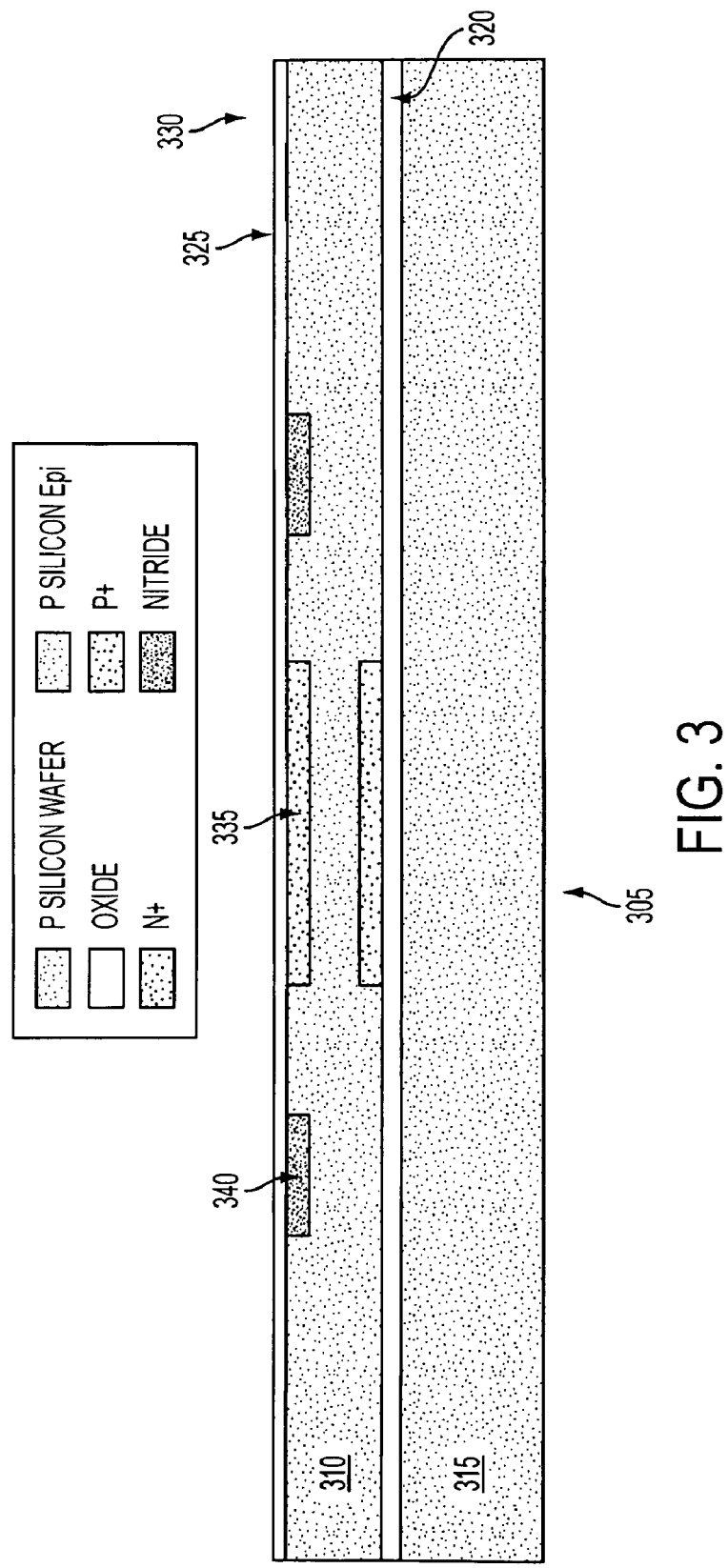

FIGS. 3-7A are sectional side views illustrating a method of manufacturing an active MEMs structure consisting of a single crystal silicon island supported by mechanical bridges 130, 135 and in corresponding active components (e.g., diodes and/or transistors). Referring to FIG. 3, the method preferably starts with a silicon-on-insulator (SOI) substrate 305 having upper 310 and lower 315 layers of silicon separated by a buried oxide layer 320. The method makes advantageous use of the buried oxide layer 320 during processing to protect active and passive elements of the bolometer in the upper layer 310 and to enable formation of a heat bath, that, once formed, will extend around the passive and active elements in the upper layer 310. In a preferred embodiment, the lower layer 315 is made of a single crystal silicon wafer. The upper layer of silicon 310 is formed by wafer bonding single crystal silicon on top of the oxide layer 320 followed by thinning. The upper layer 310 could alternatively be formed by bonding a thin layer of single crystal silicon to the oxide layer 320, e.g., using the well known semiconductor industry "smart cut" process. To ensure suitable thermal contact between the upper 310 and lower 315 layers of the heat bath 110, the buried oxide 320 is thin, (e.g. about 200 nm) and, in a preferred embodiment, spans the entire area of the silicon substrate 315. The thicknesses of the substrate 315 and the upper 310 layer of silicon are chosen based on the wafer size and requirements for the passive and active elements to be formed within them, respectively.

Referring still to FIG. 3, the method includes growing a second oxide layer 325 on the upper surface of the SOI single crystal layer 310 and depositing a silicon nitride dielectric 330 over the second oxide layer 325. The second oxide layer 325 will serve as a mask and should be thick enough to isolate the top of the silicon from subsequent etching steps, such as the $XeF_2$ etch used to define active MEMs features of the device as described below. As described in greater detail below, portions of the region between the first 320 and second 325 oxide layers are to be used to form active MEMs elements. This region should be large enough to contain the desired circuitry. In an embodiment, the method includes forming N+ regions 335 and P+ regions 340. In this embodiment, the N+ regions 335 and P+ regions 340 are used to form active elements, such as diodes in the detector stage 120.

Figure 4:
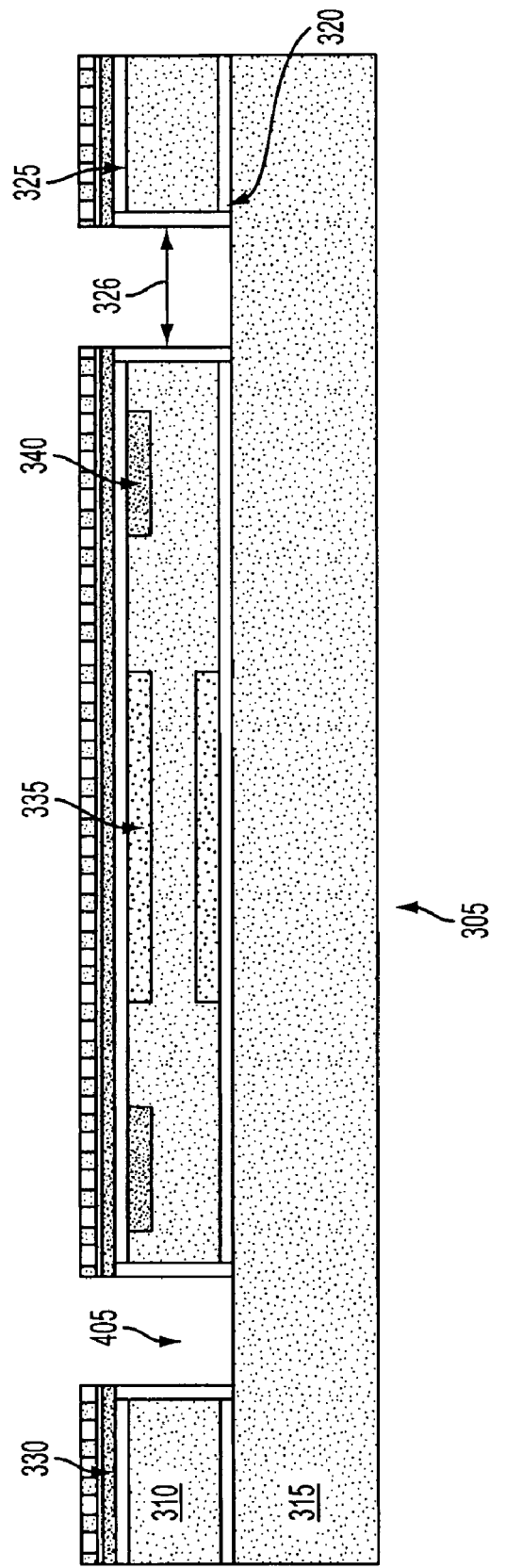

Referring now to FIG. 4, a plurality of trenches 405 are cut in the SOI wafer 305 to define the outlines of the various stages and location of the bridges in each active MEMs structure. FIG. 4 is a partial pixel cross-section of the wafer 305 showing two trench portions 405, which delineate the extent of the active MEMs area. Above the second oxide layer 325 is a silicon nitride dielectric layer 330, which serves as a mask for etching the trenches 405. The trenches 405 are circular and the sections shown are the left and right portions of the trench 405. The trenches 405 are cut sufficiently deep to reach the buried oxide layer 320. This step is followed by oxidizing the trench sidewall at 326 and removing within the trench area 405 the exposed buried oxide layer 320. Thus the active MEMs silicon region, formed in layer 310, is enclosed and encapsulated by an oxide blanket. The width of the central trench 405 will define the width of the bridges (see FIG. 1 at 130, 135). A bridge should be thick enough to provide mechanical support, while being thin enough to provide thermal isolation.

Figure 5:
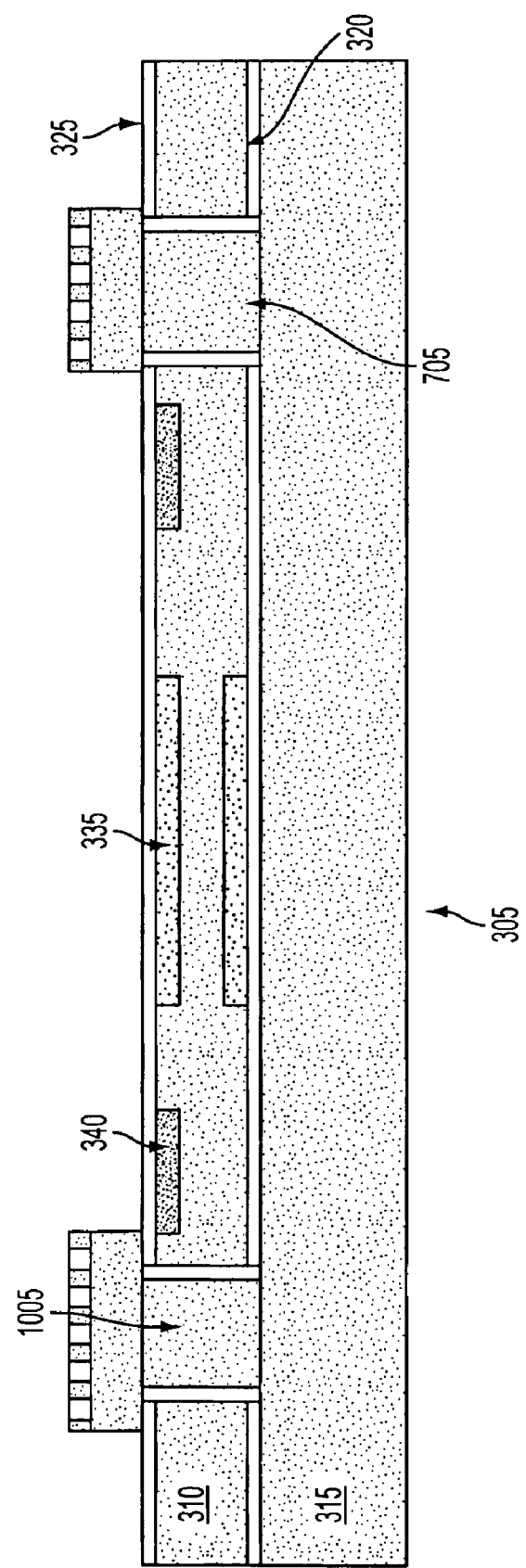
Figure 6:
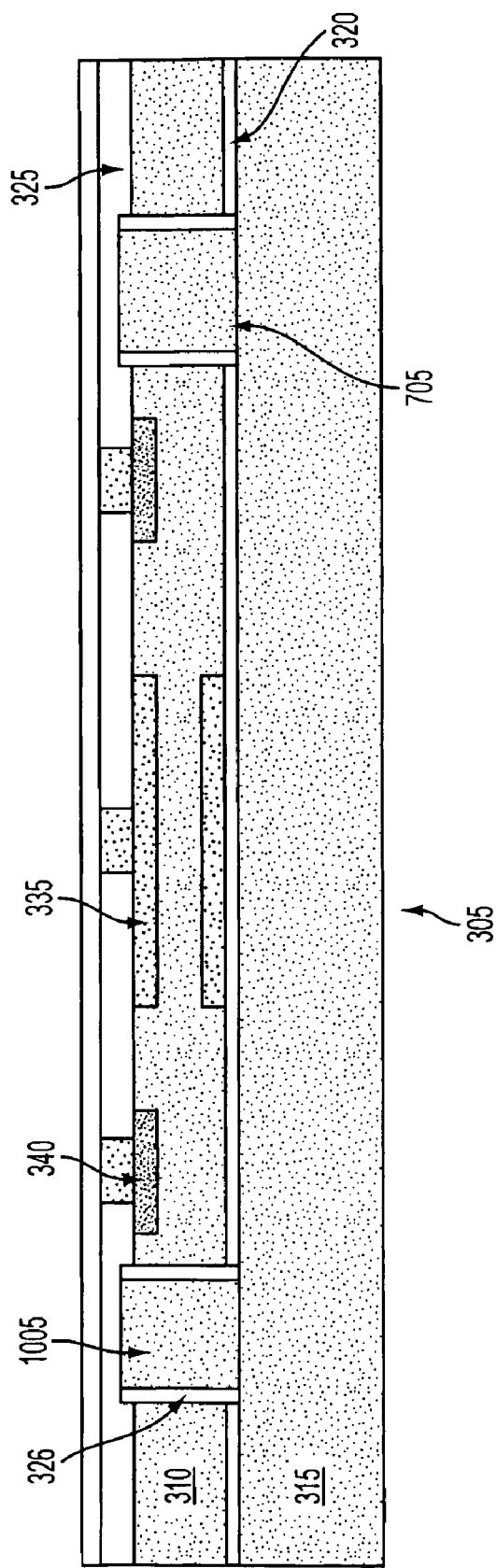

Referring to FIG. 5, the plurality of trenches 405 are filled with polysilicon 1005 and the structure is planarized, as shown in FIG. 6. Thermal bridges 130, 135 are formed next. The method preferably also includes performing a Chemical-Mechanical Planarization (CMP) processing step on the top surface to remove the nitride layer and the excess polysilicon to thereby planarize the surface for further processing. After the bridges 130, 135 are fabricated the next step is to expose all the trench areas 405 not used for bridges 130, 135 by removing any non-bridge layers formed over the trench fill areas.

Figure 7A:
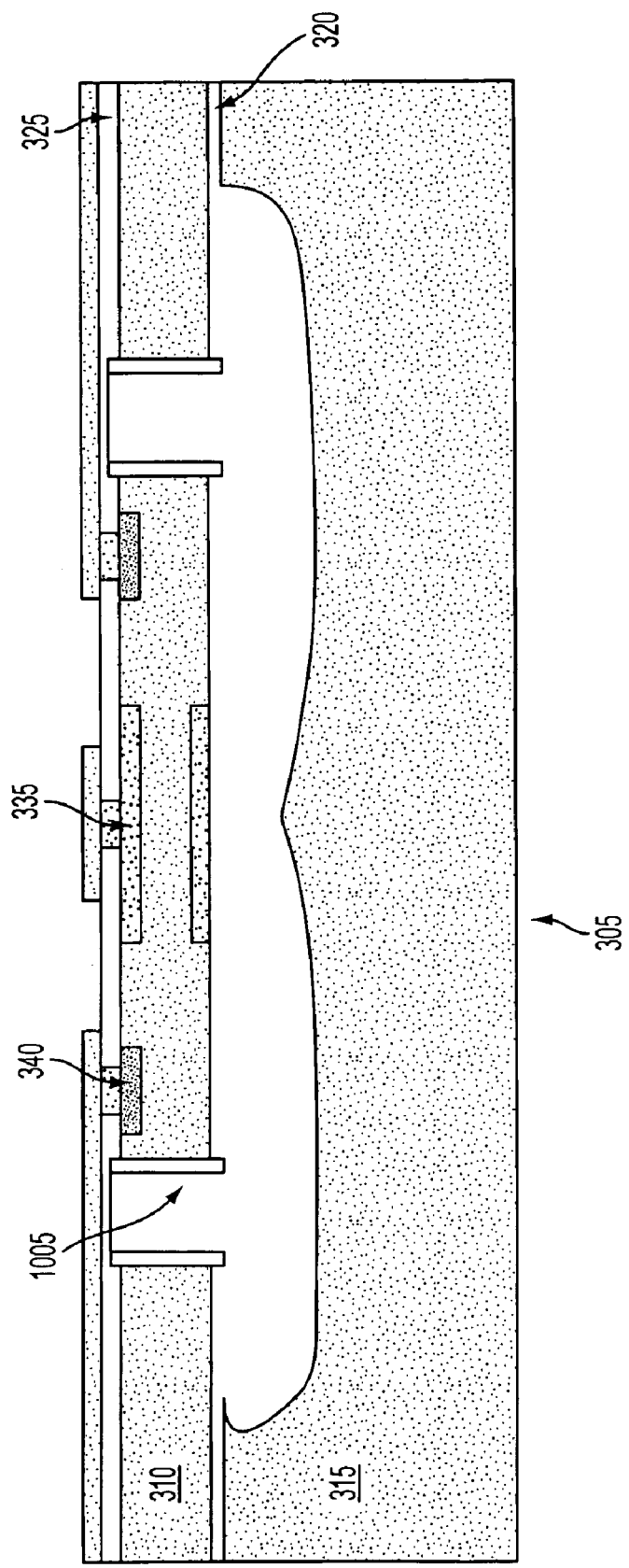

FIG. 7A shows how the active MEMs are formed during the bridge release process by removing the polysilicon 1005 used to fill the trench during the release process. Additionally, the silicon immediately below the active MEMs stage is also removed during this release process. The first oxide layer 320 protects from below the active MEMs region. As a result of this process, each section of the active MEMs region formed in a portion of the single crystal layer 310 is now encased or encapsulated on the top, bottom and the peripheral edges with a layer of silicon oxide. The bridges 130 connect the active MEMs region to the remaining and unetched portions of the SOI regions.

Figure 7B:
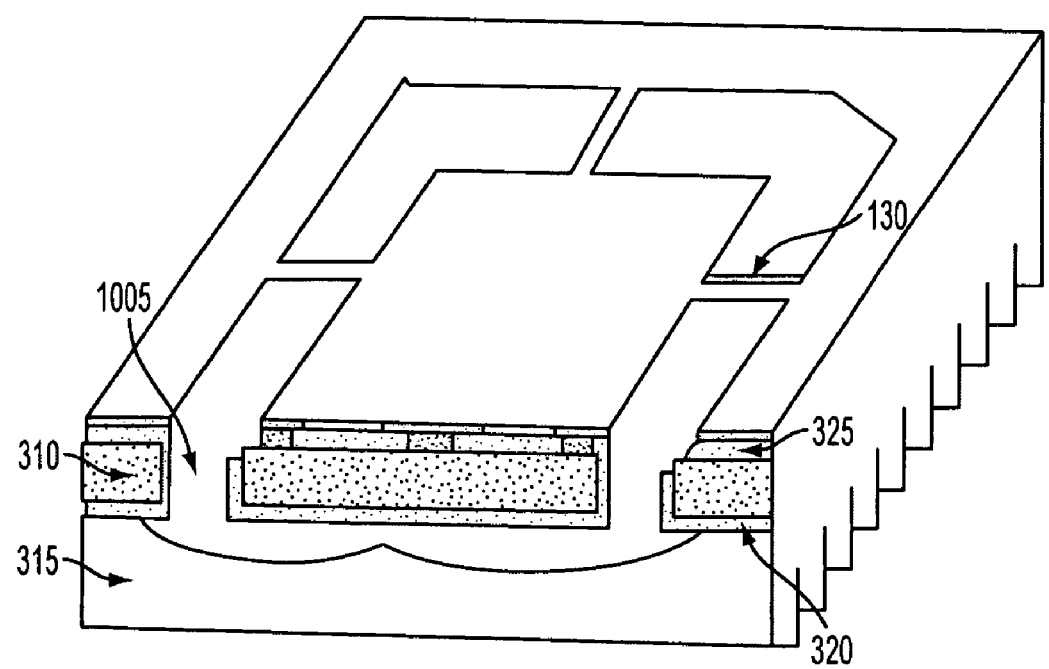
FIG. 7B is a perspective view of the active MEMs device shown in FIG. 7A.

FIG. 7B shows an isometric view after release for the embodiment of an active MEMs formed in a rectangular single crystal silicon island and supported by several bridges 130. As previously described, the trenches were filled with a sacrificial material such as polycrystalline or amorphous silicon and this material was etched during the release process. Because any MEMs structure is very fragile after the bridges 130 are released, the release should be the last fabrication step. Any silicon IC processing to form transistors, diodes or any other components must be performed before the bridge release process.

Figure 8:
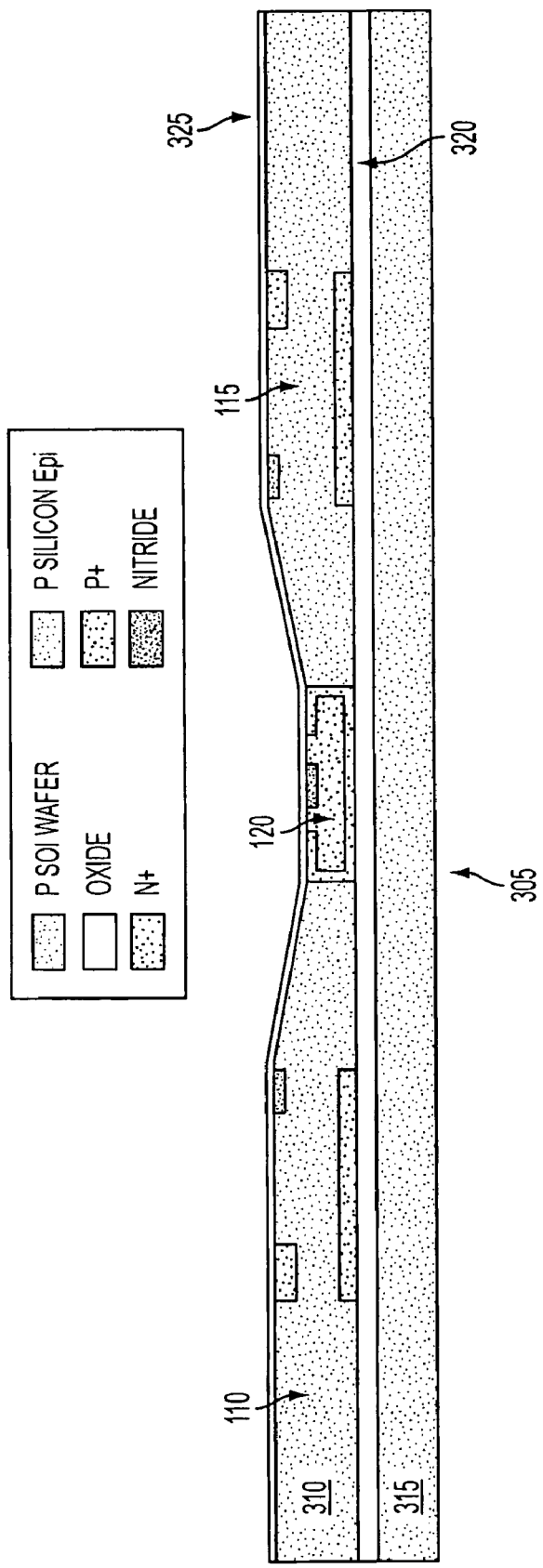
FIGS. 8-14 are cross sectional views illustrating a method of making a bolometer pixel according to an embodiment of the present invention.

FIG. 8 is an illustration of a SOI wafer after the initial steps for fabricating a bolometer according to the present invention. The following sequence describes how to fabricate a bolometer with active thermal isolation requiring two active MEMs stages: a detector stage 120 and an intermediate stage 115. The active MEMs in the detector stage 120 are nested relative to the active MEMs in the intermediate stage 115. The fabrication process begins similarly to the process used to fabricate the structure with a single active MEMs (FIGS. 3 through 7B). As for the single active MEMs, SOI wafers are used for fabricating a bolometer with active thermal isolation incorporating two active MEMs in each pixel. The active MEMs are formed in portions of region 310. Region 310 is a single crystal silicon layer formed over an oxide 320 and supported by a substrate 315 that is preferably single crystal silicon wafer. In this illustration, the detector stage 120 is thinned to reduce/minimize thermal mass and the thermal time constant. Thinning is optional and when not used layer 310 covered by an oxide 325 will exhibit a square profile like corresponding regions in FIG. 3. All the active and passive circuit components must be formed before the bridges are released. In FIG. 8, the active components are formed before proceeding with the processing steps needed for the release trenches and supporting mechanical and thermal isolation bridges.

Figure 9:
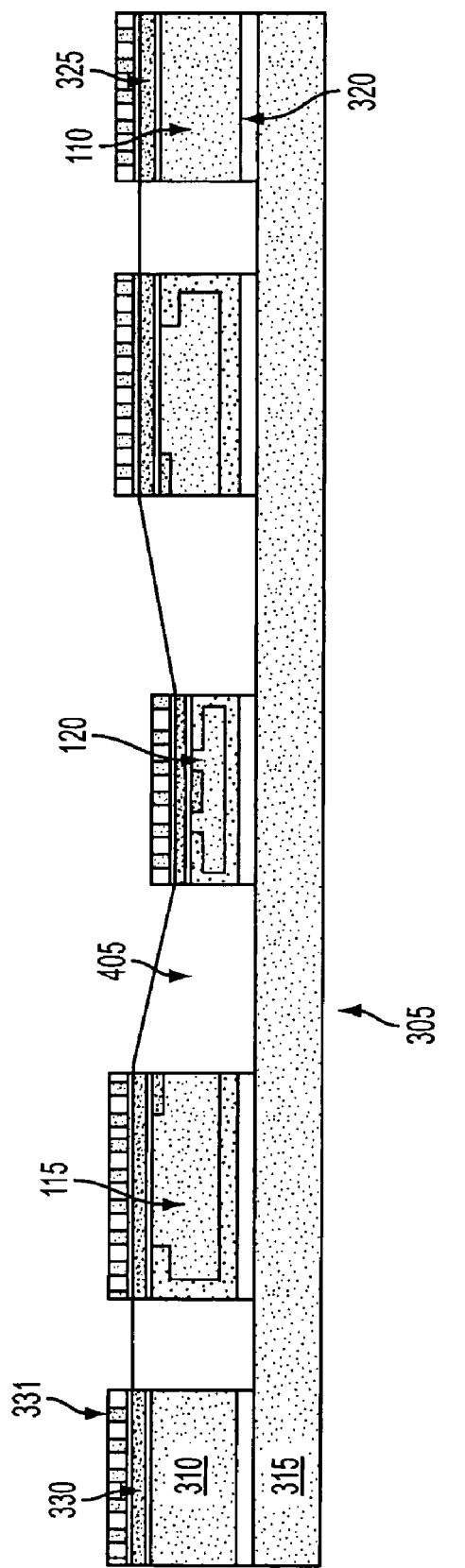
Figure 10:
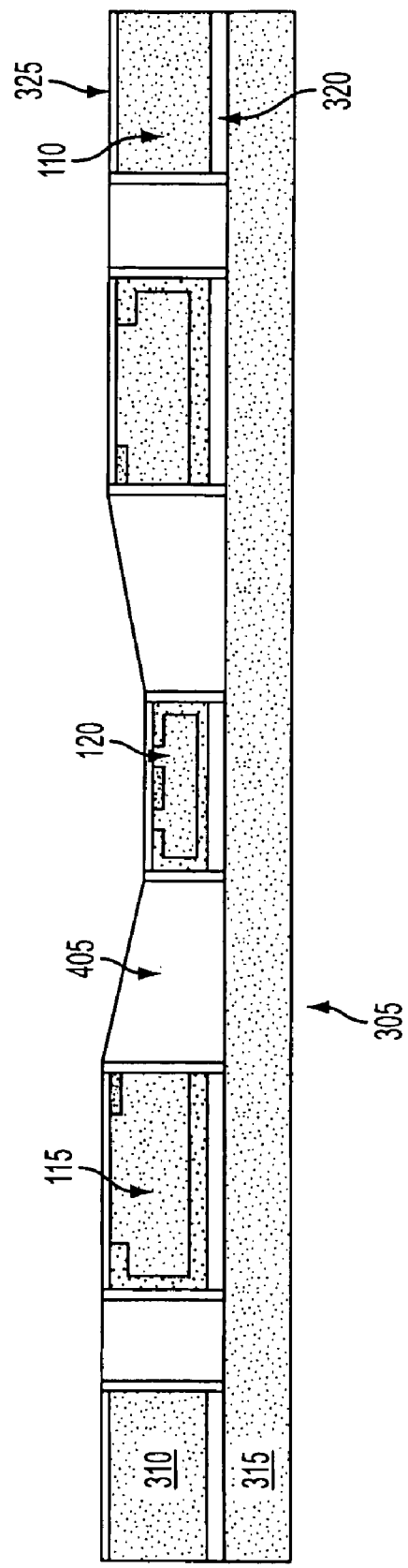

Fabrication of the release trenches 405 is illustrated in FIG. 9, where a Nitride layer 330 is deposited over the oxide layer 325 before the silicon fill material 1005 in the trenches are etched using photoresist 331. A dry etch is performed to remove the silicon in the trench areas 405, as well as the oxide 320 at the bottom of each trench 1005. The trench sidewalls are oxidized at 326 and the oxide grown at the bottom of each trench 405 during oxidation is removed, e.g., by a self aligned oxide etch. This process step laterally defines the location and size of the single crystal silicon island formed in the layer 310 for the detector and intermediate stages. The nitride 330 that was used for the self aligned etch of the oxide grown at the bottom of each trench 405 is removed and the profile of this structure is illustrated in FIG. 10.

Figure 11:
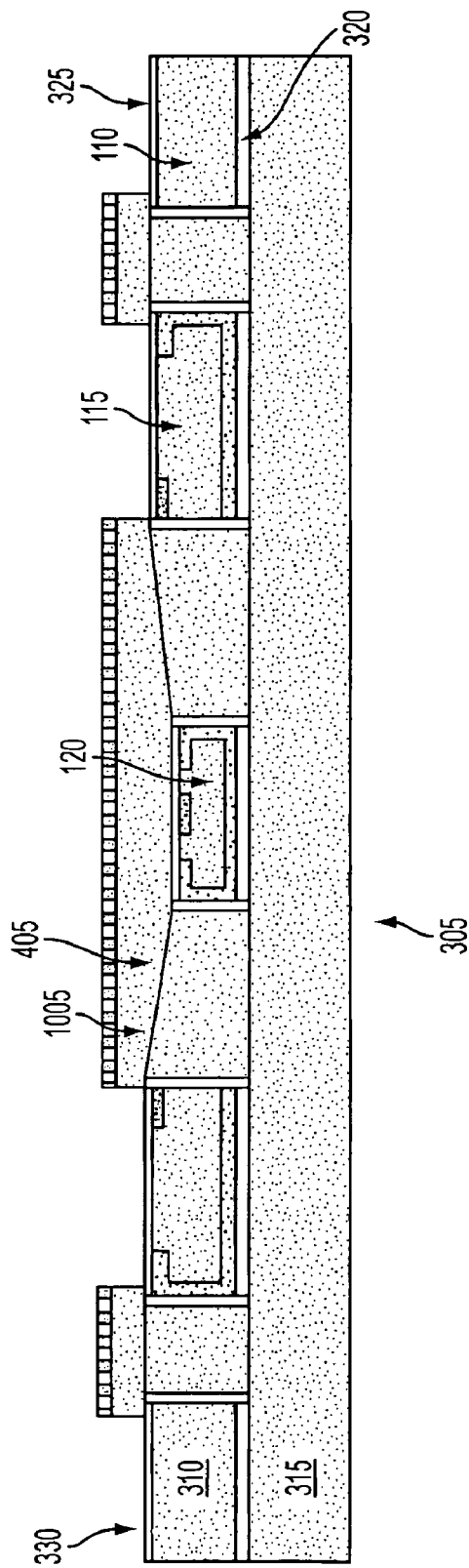
Figure 12:
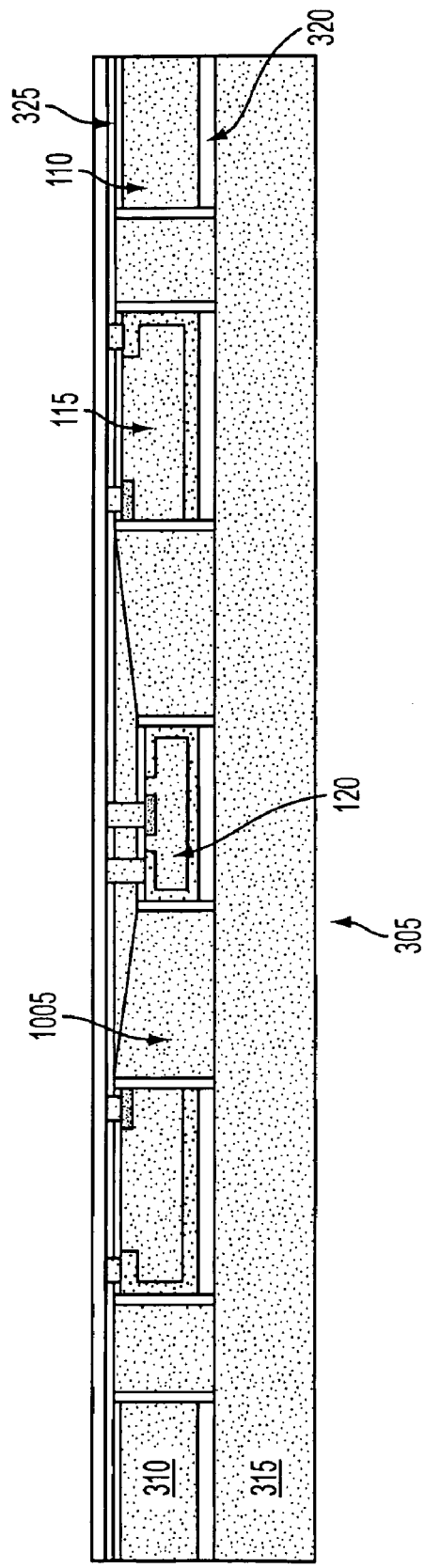

Referring now to FIG. 11, the filled trenches 405, the oxide protected detector 120, intermediate 115 and heat bath 110 stages along with the oxide protected bridges are covered with polysilicon (or amorphous silicon) layer 1005 sufficiently thick (e.g., about three microns) to fill in the trenches. The polysilicon filling layer 1005 is covered with Nitride 330, and the Nitride 330 is patterned to protect the trench areas 405. The polysilicon 1005 is removed in the field areas leaving excess polysilicon 1005 only over the trench areas 405 and the detector stage 120, which is illustrated in profile in FIG. 11. The Nitride 330 is removed followed by a CMP planarization process step to form the structure illustrated in FIG. 12. This completes fabrication of all the active circuits and trenches 405 used for the active MEMs release. Next we proceed to form the thermal isolation bridges (see 130, 135 in FIGS. 1 and 2).

The thermal isolation bridges are formed over the oxide layer 325 covering the trench areas 405. The thermal isolation bridges 130, 135 are made from thermal insulating material like silicon dioxide or silicon nitride and an electrical conductor, for example, Nichrome. The insulating material is used to give the bridges mechanical strength and poor thermal conductivity. The metal providing electrical access to the active MEMS components, for example, Nichrome, is selected to have poor thermal conductivity. The poor thermal conductivity is facilitated by making the bridge metal much thinner than the bridge insulator. The bridges 130, 135 are made as long as possible to minimize thermal conductivity. Shaping the bridges 130, 135 into a circumferential geometry (see FIG. 1) increases the bridge length for the available area. After depositing the bridge insulator, the bridge metal is deposited over the insulator. Bridges 130, 135 made with Nichrome metal are patterned with a lift-off process. The bridge metal is protected by a second insulator deposited over the bridge metal. Thus the bridge metal is surrounded by oxide which protects it from etching during the release process. The bridges are completed when the insulator portion of the bridges is defined by etching. Etching the insulator bridge portions also exposes the polysilicon used to fill the trenches 1005 shown in FIGS. 11 and 12.

The next stage of fabrication is the incorporation of the microantenna structure 710 to recover the bolometer pixel area efficiency (see FIG. 2) Every pixel's microantenna 710 channels all the radiation falling within a pixel 105 to the detector stage 120 by an AC coupled high frequency circuit. The microantenna 710 and AC coupling circuits are tuned to operate at the bolometer's imaging frequency band. Fabrication of the microantenna structure 710 starts after the bridge formation process that removed the insulation protecting the trenches 405 containing the sacrificial polycrystalline (or amorphous) silicon 1005. Several microns of polysilicon 1005 (or amorphous silicon) are deposited over the entire wafer 305. The deposited polysilicon layer 1005 is patterned to form pedestals for the microantenna 710 which needs to be over and very close to the detector stage 120 to maximize AC coupling between the microantenna 710 and the active MEMS detector stage 120. Oxide is deposited on the patterned microantenna pedestal and the metal microantenna 710 is formed in each pixel 105. Windows are opened in the top oxide layer 325 exposing the silicon used to form the microantenna pedestals. This structure is illustrated in FIG. 13.

Figure 13:
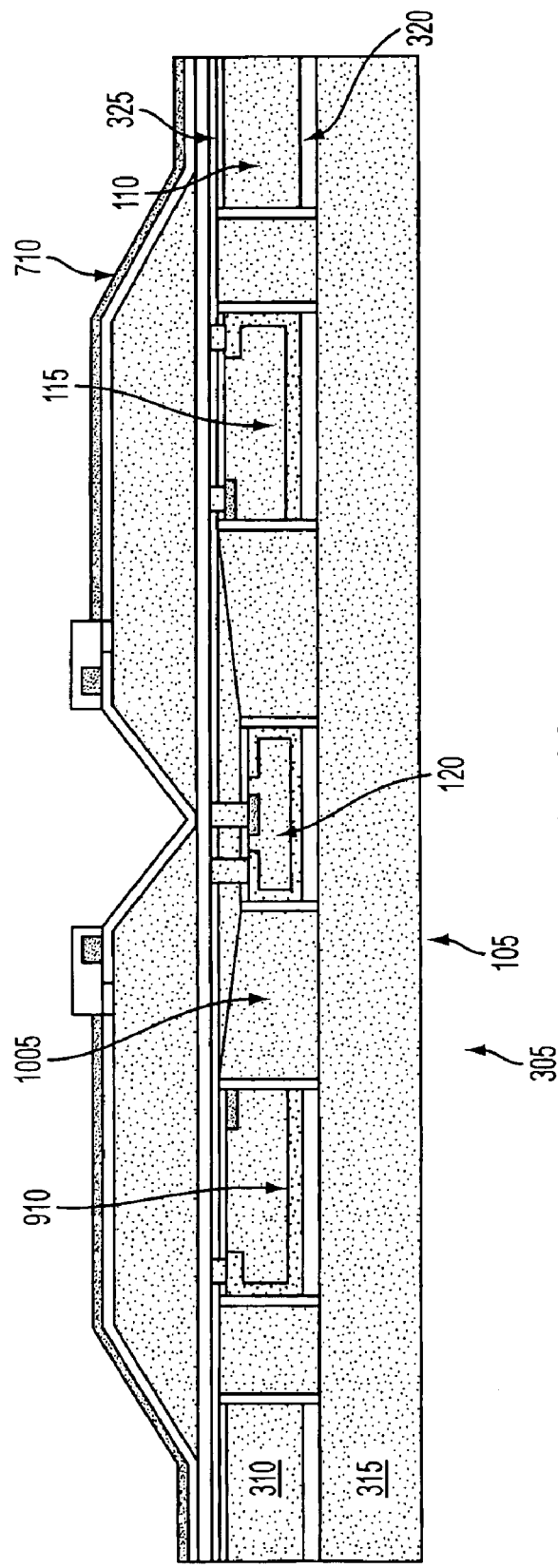
Figure 14:
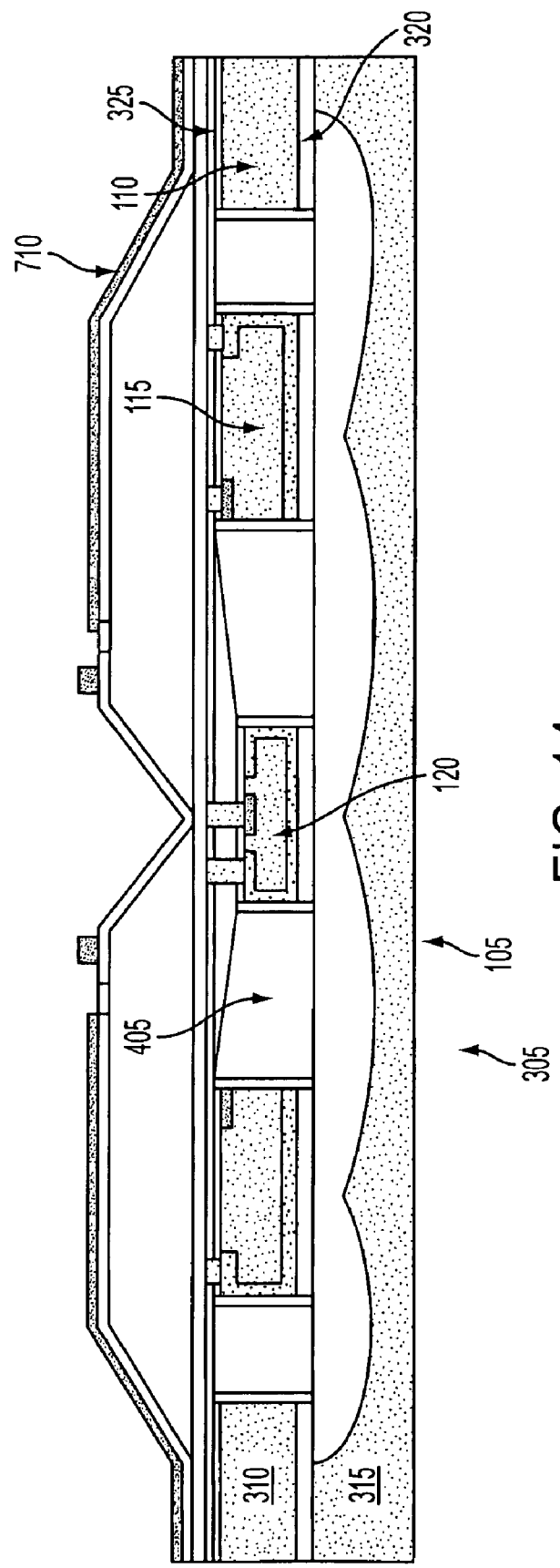

Before bridge release, the structure shown in FIG. 13 represents a completed bolometer pixel 105 with active thermal isolation mechanized by two active MEMs and a microantenna 710 in each pixel 105. The bridge release is the last IC fabrication step. The silicon trench fillers 1005 and microantenna pedestals are removed with a dry isotropic etch, preferably a $XeF_2$. This etch only etches the sacrificial silicon 1005 while all the other areas are protected by an oxide blanket 325. The microantenna 710 and the bonding pads are protected by gold that is not attacked by $XeF_2$. The $XeF_2$ also etches the substrate regions 315 below the detector 120 and intermediate stages 115 (see FIG. 14).

While this invention has been described in conjunction with specific embodiments thereof, many alternatives, modifications and variations will be apparent to those skilled in the art. For example, it will be appreciated that the method can be used to manufacture any device incorporating both MEMs and active electronics. In the case of a bolometer, the device can be manufactured with or without an antenna or lens. Similarly, the SOI substrate can be formed by growing an oxide layer and a Si epitaxial layer on a single wafer of bulk processed Si, as previously described, or by sandwiching the oxide layer between a pair of Si wafers or other suitable wafers. Further, embodiments of the present invention may be realized in semiconductor materials other than silicon. Steps can be performed in the order described or they can be rearranged to be performed in a different order, so long as the circuitry is encapsulated or otherwise protected before releasing the MEMs components.

Accordingly, the preferred embodiments of the invention as set forth herein, are intended to be illustrative, not limiting. Various changes may be made without departing from the true spirit and full scope of the invention as set forth herein.

The invention claimed is:

1. A method of manufacturing a bolometer, comprising:
providing a silicon-on-insulator wafer having upper and lower silicon layers separated by a buried oxide layer,
forming a detector in the upper silicon layer of the silicon-on-insulator wafer,
forming one or more trenches in the upper silicon layer of the silicon-on-insulator wafer around the detector,
forming active thermal compensation circuitry in an upper region outside the one or more trenches,
encapsulating the detector using the buried oxide layer,
releasing the detector using an etchant compatible with the buried oxide layer, and
providing mechanical support for the detector.

2. A method, as in claim 1, wherein the etchant is a dry etchant.

3. A method, as in claim 2, wherein the dry etchant is at least one of xenon difluoride or sulfur hexafluoride.

4. A method, as in claim 1, further comprising forming a microantenna above the silicon-on-insulator wafer and coupled to the detector.

5. A method, as in claim 4 further comprising forming a passive component in the silicon-on-insulator wafer, wherein the passive component is a capacitor coupled with the microantenna.

6. A method, as in claim 1, further comprising forming a passive component in the silicon-on-insulator wafer.

7. A method, as in claim 6, wherein the passive component is a capacitor coupled with a microantenna.

8. A method, as in claim 1, further comprising forming an oxide ring in at least one of the one or more trenches.

9. A method, as in claim 1, further comprising forming a N+ region in the upper silicon layer of the silicon-on-insulator wafer.

10. A method, as in claim 1, further comprising forming a P+ region in the upper silicon layer of the silicon-on-insulator wafer.

11. A method, as in claim 1, further comprising filling at least part of a trench with a sacrificial silicon material.

12. A method, as in claim 1, wherein the lower silicon layer of the silicon-on-insulator wafer is large enough to be a heat bath for the detector.

13. A method, as in claim 1, wherein the mechanical support includes a poor thermal conductor.

14. A method, as in claim 1, wherein the detector is encapsulated by an oxide blanket.

15. A method, as in claim 1, wherein the detector is encapsulated using a second oxide layer and oxidized side walls in addition to the buried oxide layer.

16. A method, as in claim 1, wherein the detector is encapsulated using a second oxide layer located on an upper surface of the upper silicon layer of the silicon-on-insulator wafer in addition to the buried oxide layer.

17. A method of manufacturing a hybrid device combining integrated circuits and micro-electrical-mechanical systems, comprising:
providing a silicon-on-insulator wafer having upper and lower silicon layers separated by a buried oxide layer,
forming an active circuit element in the upper silicon layer of the silicon-on-insulator wafer,
forming one or more trenches in the upper silicon layer of the silicon-on-insulator wafer around the active circuit element,
encapsulating the active circuit element using the buried oxide layer,
releasing a portion of the upper silicon layer that contains the active circuit element using an etchant compatible with the buried oxide layer, and
providing mechanical support for the active circuit element.

18. A method, as in claim 17, wherein the etchant is a dry etchant.

19. A method, as in claim 17, wherein the etchant is xenon difluoride.

20. A method, as in claim 17, further comprising forming a passive component in the silicon-on-insulator wafer.

21. A method, as in claim 17, further comprising forming a N+ region in the upper silicon layer of the silicon-on-insulator wafer.

22. A method, as in claim 17, further comprising forming a P+ region in the upper silicon layer of the silicon-on-insulator wafer.

23. A method, as in claim 17, further comprising filling at least part of a trench with a sacrificial silicon material.

24. A method, as in claim 17, further comprising forming a second active circuit element in the upper silicon layer of the silicon-on-insulator wafer.

25. A method, as in claim 17, wherein the active circuit element is encapsulated by an oxide blanket.

26. A method, as in claim 17, wherein the active circuit element is encapsulated using a second oxide layer and oxidized side walls in addition to the buried oxide layer.

27. A method, as in claim 17, wherein the active circuit element is encapsulated using a second oxide layer located on an upper surface of the upper silicon layer of the silicon-on-insulater wafer in addition to the buried oxide layer.

* * * * *